United States Patent [19]
Ross et al.

[11] Patent Number: 5,835,335
[45] Date of Patent: Nov. 10, 1998

[54] UNBALANCED BIPOLAR ELECTROSTATIC CHUCK POWER SUPPLIES AND METHODS THEREOF

[75] Inventors: Charles P. Ross, San Jose; Canfeng Lai, Fremont, both of Calif.

[73] Assignee: Lam Research Corporation, Fremont, Calif.

[21] Appl. No.: 824,104

[22] Filed: Mar. 26, 1997

[51] Int. Cl.⁶ .................................................. H02N 13/00
[52] U.S. Cl. ........................ 361/234; 361/235; 279/128
[58] Field of Search ................................. 361/230, 233, 361/234, 235; 269/8, 903; 279/128

[56] References Cited

U.S. PATENT DOCUMENTS

| | | |
|---|---|---|
| 4,692,836 | 9/1987 | Suzuki . |
| 5,325,261 | 6/1994 | Horwitz . |
| 5,463,525 | 10/1995 | Barnes et al. ............................ 361/234 |
| 5,467,249 | 11/1995 | Barnes et al. ............................ 361/234 |
| 5,535,507 | 7/1996 | Barnes et al. ............................ 361/234 |
| 5,557,215 | 9/1996 | Saeki et al. ......................... 204/298.31 |
| 5,561,585 | 10/1996 | Barnes et al. ............................ 361/234 |
| 5,708,250 | 1/1998 | Benjamin et al. . |

FOREIGN PATENT DOCUMENTS

| | | |
|---|---|---|
| 0 395 340 a2 | 10/1990 | European Pat. Off. . |
| 0 439 000 B1 | 9/1994 | European Pat. Off. ....... H02N 13/00 |
| 37 05 866 a1 | 9/1988 | Germany . |
| WO 97/37382 | 10/1997 | WIPO . |

OTHER PUBLICATIONS

Internationa Search Report Dated Jul. 9, 1998 for PCT/US98/05676 (international counterpart to the present application).

*Primary Examiner*—Fritz Fleming
*Attorney, Agent, or Firm*—Beyer & Weaver, LLP

[57] ABSTRACT

A method of providing unbalanced voltages to a bipolar electrostatic chuck of a substrate processing chamber. The method includes providing a variable balanced voltage power supply, which is configured for producing, responsive to a control signal, balanced differential output voltages on a first and second terminals of the variable balanced voltage power supply. The method further includes coupling the first terminal of the variable balanced voltage power supply to a first node. The first node is coupled to a first resistive element of a resistor bridge. The method also includes coupling the second terminal of the variable balanced voltage power supply to a second node. The second node is coupled to a second resistive element of the resistor bridge. The first resistive element is lower in resistance value than the second resistive element. There is further included coupling the first resistive element and the second resistive element to a common reference terminal, thereby producing, without employing a power supply other than the variable balanced voltage power supply, the unbalanced voltages at the first node and the second node when the variable balanced voltage power supply is turned on.

20 Claims, 10 Drawing Sheets

UNBALANCED BIPOLAR ELECTROSTATIC CHUCK POWER SUPPLIES AND METHODS THEREOF

BACKGROUND OF THE INVENTION

The present invention relates to semiconductor devices and apparatus for their manufacture. More particularly, the present invention relates to improved apparatus and methods for clamping a semiconductor substrate on a bipolar electrostatic chuck in a plasma processing chamber.

The use of bipolar electrostatic chucks in plasma processing systems is well known. To facilitate discussion of the foregoing, FIG. 1 illustrates a simplified schematic of a substrate processing chamber known as the TCP 9400 SE™, which is available from Lam Research Corporation of Fremont, Calif., and which represents a chamber suitable for use with a bipolar electrostatic chuck. Referring to FIG. 1, a substrate plasma processing system 100 includes a plasma processing chamber 102. Above chamber 102, there is disposed an electrode 103, which is implemented by a coil in the example of FIG. 1. Coil 103 is typically energized by a RF generator 105 via a matching network (not shown in FIG. 1).

Within chamber 102, there is provided a gas ring 104, which preferably includes a plurality of orifices for releasing gaseous source materials, e.g., the etchant source gases, into the RF-induced plasma region between above substrate 150, representing for example a semiconductor substrate or a flat panel display. The gaseous source materials may also be released from ports built into the walls of the chamber itself or from a showerhead-type apparatus disposed above the substrate.

Substrate 150 is introduced into chamber 102 and disposed on a bipolar electrostatic chuck 110, which acts as a second electrode. Bipolar electrostatic chuck 110 typically receives RF power from an RF generator 120 (also typically via a matching network). A power supply 152 biases the poles of the bipolar electrostatic chuck to clamp substrate 150 thereon. The mechanism involved in clamping substrate 150 to chuck 110 is discussed subsequently herein.

To protect power supply 152 from the RF energy supplied by RF generator 120, RF filters (conventional and omitted from FIG. 1 to simplify the illustration) may be disposed between power supply 152 and RF generator 120. Analogously, dc blocking capacitors (conventional and omitted from FIG. 1 to simplify the illustration) may also be disposed between power supply 152 and RF generator 120 to prevent RF generator 120 from being affected by the dc potential levels supplied by power supply 152.

Helium cooling gas is introduced under pressure (e.g., about 5–10 Torr in one embodiment) between chuck 110 and substrate 150 to act as a heat transfer medium for accurately controlling the substrate's temperature during processing to ensure uniform and repeatable process results. During plasma processing, the pressure within chamber 102 is preferably kept low by withdrawing gas through port 160, e.g., between about 5 to 25 mTorr in one embodiment. A plurality of heaters (omitted from FIG. 1 to simplify the illustration) may be provided to maintain a suitable chamber temperature for etching (e.g., about 70° C. in one embodiment). To provide an electrical path to ground, the chamber wall of chamber 102 is typically grounded.

FIG. 2 illustrates in greater detail a cross-section of bipolar electrostatic chuck 110 of FIG. 1. For ease of illustration, bipolar chuck 110 is arranged in a configuration commonly known as "donut-and-base." This configuration is more clearly illustrated in the top view of FIG. 3. As the name implies, bipolar electrostatic chuck 110 has two poles: a positive pole 204 and a negative pole 206. Bipolar electrostatic chuck 110 is shown in its preferred negative base configuration although the invention is not limited to negative base configurations only.

Above the poles of the bipolar electrostatic chuck, there is disposed a dielectric layer 212, which may be made of any suitable dielectric material such as ceramic, polymer, or the like. Wafer 208 is placed on top of this dielectric layer 212 of the bipolar ESC chuck for processing.

In FIG. 2, the poles of the bipolar electrostatic chuck are coupled to a power supply 210. When power supply 210 is turned on, negative pole 206 is negatively biased by a power supply 210 relative to the common reference potential level. Power supply 210 also biases positive pole 204 positively relative to the common reference potential level. For a p-type semiconductor wafer, the presence of a negative potential on negative pole 206 electrostatically induces the positive charges or holes in wafer 208 to move toward the wafer region overlying negative pole 206. Conversely, for an n-type semiconductor wafer, electrons in wafer 208 migrate toward the wafer region overlying positive pole 204. As a result, electrostatic forces between the poles and their respective overlying wafer regions are created to provide the clamping forces required to keep wafer 208 clamped to bipolar electrostatic chuck 110 during processing.

If the poles are biased equally with opposite polarities relative to a common reference voltage level, an imbalance in the electrostatic forces over the poles may occur when the plasma is turned on and the wafer becomes biased negatively. To illustrate this condition, consider the case where power supply 210 biases positive pole 204 at +350 V and negative pole 206 at −350 V relative to the common reference voltage level. With the plasma off, the wafer potential is at 0 V relative to the common reference voltage level, and the potential differences between the poles of bipolar chuck 110 and their overlying wafer regions are +350 V and −350 V respectively.

When wafer 208 is negatively charged due to the presence of plasma, however, the potential differences between the wafer and the two poles of the bipolar electrostatic chuck become asymmetric. For example, the wafer bias voltage may be −100 V when the plasma is turned on. In this case, the potential difference between the positive pole and the negatively biased substrate is increased to +450 V, i.e., (+350 V−(−100 V)). However, the potential difference between the negative pole and the negatively biased wafer is decreased to only −250 V, i.e., (−350 V−(−100 V)). The reduction in the potential difference reduces the electrostatic holding force between the negative pole and the wafer. Consequently, some heat-exchange gas may escape, resulting in inadequate temperature control and/or process variations. In some cases, the electrostatic force holding the wafer to the bipolar chuck may become so weak that it is insufficient to resist the force exerted on the wafer by the pressure differential between the helium cooling pressure and the low pressure within the chamber, resulting in the wafer "popping off" the chuck's surface.

Further, the plasma-induced negative wafer bias may unduly increase the potential difference between the negatively-biased wafer and the positive pole of the bipolar chuck. An excessively high potential difference may cause arcing, i.e., sparking, between the lower surface of the wafer and the upper surface of the chuck, resulting in pit mark damage. Over time, the surface of the chuck may be damaged to the point where it becomes impossible to keep the heat-exchange gas properly sealed.

Heat-exchange gas leakage is found to be exacerbated in negative-edged bipolar chucks, such as that shown in FIG. 2 wherein the edge of bipolar electrostatic chuck 110 is negatively charged. This is because there is less electrostatic force over the edge region of the negative-edged bipolar electrostatic chuck 110 when the plasma is turned on and the wafer is negatively biased. Positive-edged bipolar electrostatic chucks, while being more effective at clamping the wafer's edge against the chuck and therefore reducing helium leakage, are nonetheless not favored since they tend to create conditions wherein large leakage currents between the plasma and the chuck's edge may occur. Positive-edged bipolar electrostatic chucks also exacerbate wafer sticking, further contributing to their unpopularity.

In the commonly assigned U.S. patent application Ser. No. 08/550,510, entitled "Negative Offset Bipolar Electrostatic Chucks" filed on Oct. 30, 1995 (Attorney Docket No. P168/LAM1P004), incorporated by reference herein, there is disclosed a technique for statically offsetting the voltage levels supplied to the bipolar electrostatic chuck such that the magnitude of the difference between the common reference voltage level and the positive pole is reduced while the magnitude of the difference between the common reference voltage level and the negative pole is amplified.

When the wafer becomes negatively charged by the presence of plasma, the difference between the wafer and the negative pole, while being reduced somewhat relative to the difference that existed prior to the time the plasma is turned on, still remains sufficiently high to keep the level of helium leakage acceptable.

Disadvantageously, however, the prior art technique of producing static offset voltages requires the use of a second power supply, other than the power supply employed to bias the chuck's poles, to offset the voltage levels supplied to the chuck's poles. The requirement of this second power supply is disadvantageous since it renders the resulting static offset power supply more expensive and cumbersome.

Dynamic feedback systems, on the other hand, attempt to vary the voltages supplied to the chuck's poles responsive to the inferred wafer DC bias. In the commonly assigned U.S. patent application Ser. No. 08/624,988, entitled "Dynamic Feedback Electrostatic Wafer Chuck" filed on Mar. 29, 1996 (Attorney Docket No. P169/LAM1P006), incorporated by reference herein, there is disclosed a technique for inferring the wafer DC bias and for employing the inferred wafer DC bias as a reference for the power supply.

In theory, as the reference voltage (i.e., the inferred wafer DC bias) becomes negative due to wafer charging, the voltage supplied to the negative pole becomes correspondingly more negative, and the voltage supplied to the positive pole becomes correspondingly less positive. Since the differences between the reference voltage (hence the wafer DC bias) and the voltage levels of the chuck's poles does not change, theoretically speaking, there should be no difference in the level of helium flow when the plasma is turned on.

In practice, it has been found that the inferred wafer DC bias is typically less than the real wafer DC bias in magnitude. Because of this, the reference voltage is typically less than the wafer real DC bias in magnitude. Accordingly,.the potential difference between the chuck's negative pole, which is referenced to the reference voltage, and the wafer DC bias actually lowers when the plasma is turned on. As mentioned earlier, the reduction in the $\Delta V$ between the negative pole and the wafer reduces the electrostatic force therebetween and undesirably increases the helium flow.

Further, it has been found that this potential difference between the reference voltage and the wafer real DC bias wafers actually increases as RF power to the chuck is increased. Accordingly, the potential difference between the negative pole and the wafer actually decreases as bias power is increased, thus causing helium flow to increase when bias power increases.

In view of the foregoing, there are desired improved techniques for improved clamping of the wafer to the bipolar electrostatic chuck, particularly in the presence of plasma. To lower cost, the improved techniques preferably do not require the use of a second power supply or complicated control circuitries.

SUMMARY OF THE INVENTION

The present invention relates, in one embodiment, to a method of providing unbalanced voltages to a bipolar electrostatic chuck of a substrate processing chamber. The method includes providing a variable balanced voltage power supply, which is configured for producing, responsive to a control signal, balanced differential output voltages on a first and second terminals of the variable balanced voltage power supply. The method further includes coupling the first terminal of the variable balanced voltage power supply to a first node. The first node is coupled to a first resistive element of a resistor bridge;

The method also includes coupling the second terminal of the variable balanced voltage power supply to a second node. The second node is coupled to a second resistive element of the resistor bridge. The first resistive element is lower in resistance value than the second resistive element. There is further included coupling the first resistive element and the second resistive element to a common reference terminal, thereby producing, without employing a power supply other than the variable balanced voltage power supply, the unbalanced voltages at the first node and the second node when the variable balanced voltage power supply is turned on.

In another embodiment, the invention relates to an unbalanced differential voltage power supply configured for supplying unbalanced voltages to a bipolar electrostatic chuck of a substrate processing chamber. The unbalanced differential voltage power supply includes a variable balanced voltage power supply, which is configured for producing, responsive to a control signal, balanced differential output voltages on a first and second terminals of the variable balanced voltage power supply. The unbalanced differential voltage power supply includes a first node, which is coupled to the first terminal of the variable balanced voltage power supply. There is included a resistor bridge having a first resistive element coupled in parallel to a second resistive element. The first resistive element is coupled to the first node.

The unbalanced differential voltage power supply also includes a second node, which is coupled to the second terminal of the variable balanced voltage power supply and the second resistive element. The first resistive element is lower in resistance value than the second resistive element. Additionally, there is included a common reference terminal coupled to the first resistive element and the second resistive element, whereby the unbalanced voltages are produced, without employing a power supply other than the variable balanced voltage power supply, at the first node and the second node when the variable balanced voltage power supply is turned on.

These and other advantages of the present invention will become apparent upon reading the following detailed descriptions and studying the various figures of the drawings.

BRIEF DESCRIPTION OF THE DRAWINGS

The present invention is illustrated by way of example, and not by way of limitation, in the figures of the accompanying drawings. In the following figures, like reference numerals refer to analogous or similar elements to facilitate ease of understanding.

FIGS. 5A and 5B illustrate the effect unbalancing the supply voltages has on the potential difference between the negative pole of the bipolar ESC chuck and the substrate when the plasma is turned on.

FIGS. 7A and 7B illustrate the effect that combining dynamic feedback and unbalanced supply voltages has on the potential difference between the negative pole of the bipolar ESC chuck and the substrate when the plasma is turned on.

DETAILED DESCRIPTION OF THE PREFERRED EMBODIMENTS

The present invention will now be described in detail with reference to a few preferred embodiments thereof as illustrated in the accompanying drawings. In the following description, numerous specific details are set forth in order to provide a thorough understanding of the present invention. It will be apparent, however, to one skilled in the art, that the present invention may be practiced without some or all of these specific details. In other instances, well known process steps have not been described in detail in order to not unnecessarily obscure the present invention.

In accordance with one aspect of the present invention, it is realized that as long as the potential difference between the negative base or pole of the bipolar electrostatic chuck and the wafer is maintained above a certain level, the helium leakage would be acceptable. It is further realized that for minimizing helium leakage, balanced voltages on the two poles of the bipolar ESC chuck are not essential. It is realized that unbalanced voltages on the poles of the bipolar ESC chuck may indeed confer advantages even when dynamic feedback is employed.

For example, if the voltages supplied to the two poles of the bipolar ESC chuck can be deliberately unbalanced (i.e., making the magnitude of the negative potential supplied to negative pole of the bipolar electrostatic chuck larger than the magnitude of the positive potential supplied to the positive pole of the bipolar electrostatic chuck), it is possible to ensure that the potential difference between the wafer and the negative pole always exceeds a minimum level, even when the wafer becomes negatively biased and its inferred DC voltage is employed as a reference to the power supply. When the unbalanced ESC power supply is employed together with dynamic feedback, it becomes possible to maintain a stable cooling helium flow, even when a high bias power is applied to the chuck's poles.

More importantly, the present invention achieves the goal of supplying unbalanced voltages to the bipolar ESC chuck's poles without requiring the use of complicated control circuitries or additional power supplies. In accordance with another advantageous aspect of the present invention, it is possible to provide fixed negative offset voltages to the ESC chuck's electrodes without requiring the use of a second power supply (i.e., an offset power supply). Compared to the technique disclosed in the aforementioned co-pending patent application Ser. No. 08/550,510, entitled "Negative Offset Bipolar Electrostatic Chucks" filed on Oct. 30, 1995 (Attorney Docket No. P168/LAM1P004), the present invention represents a significant advance since it furnishes fixed offset voltages to the bipolar ESC chuck using only a single power supply. As can be appreciated by those skilled, the ability to employ only a single power supply to obtain fixed offset voltages offers significant cost and reliability advantages.

Figure 1:
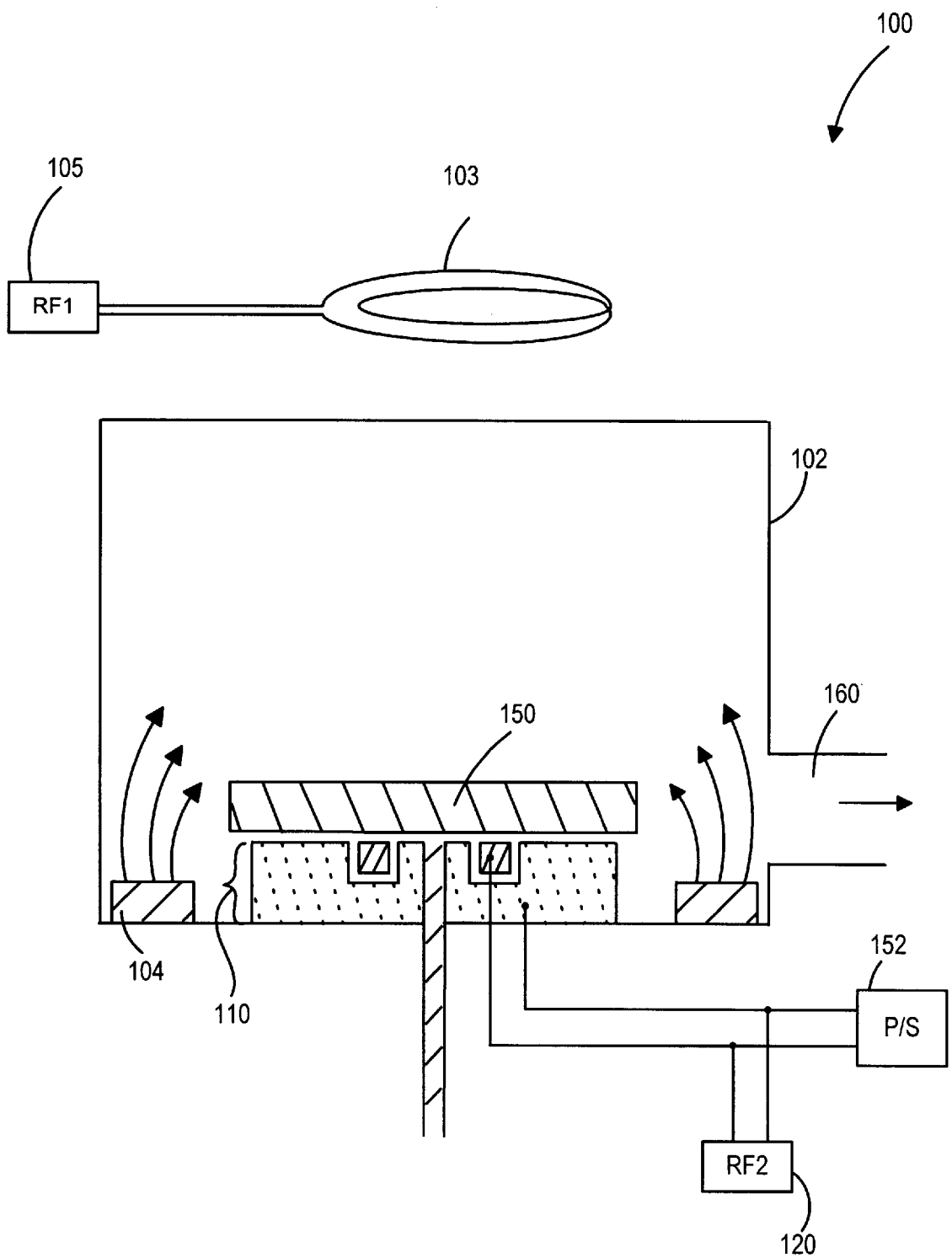
FIG. 1 illustrates, to facilitate discussion, a typical plasma substrate processing system.
Figure 4:
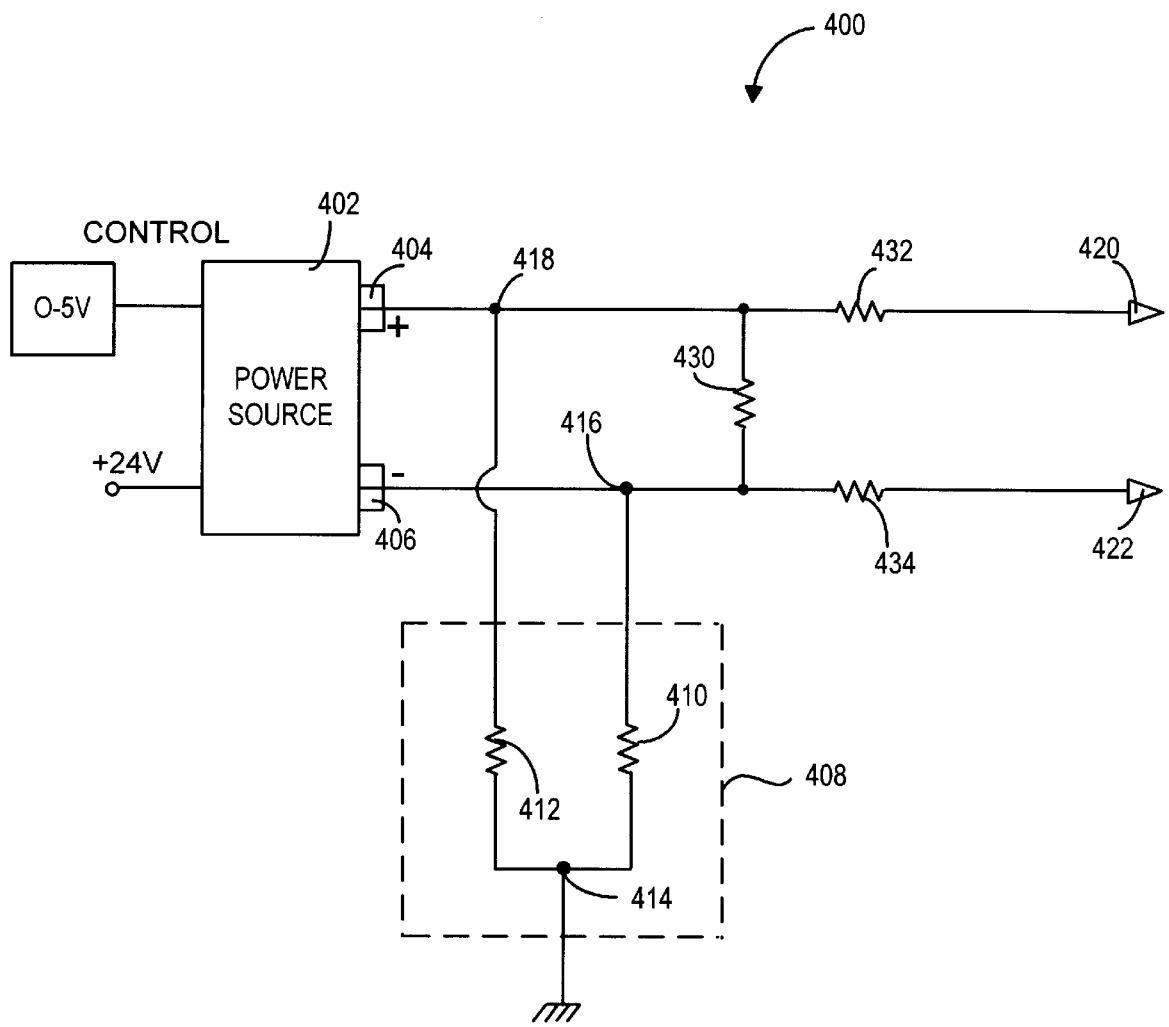
FIG. 4 illustrates, in accordance with one embodiment of the present invention, an static unbalanced bipolar electrostatic chuck power supply.

FIG. 4 illustrates, in accordance with one embodiment of the present invention, an unbalanced differential voltage power supply 400 for supplying unbalanced voltages to the poles of a bipolar electrostatic chuck, e.g., chuck 110 of FIG. 1. In the configuration of FIG. 4, unbalanced differential voltage power supply 400 includes a variable balanced voltage power source 402. As a stand-alone component, variable balanced voltage power source 402 receives as its inputs a control signal (typically a dc signal between 0 V and 5 V) and a reference voltage (about 24 V in one example), and outputs at its output terminals 404 and 406 positive and negative voltages of equal magnitudes. In the present example, variable balanced voltage power source 402 represents a power supply (model number SF-12) of American High Voltage of El Cajon, Calif. Of course, any other conventional power source may also be employed (whether or not variable).

Output terminals 404 and 406 of balanced voltage power source 402, however, is coupled to nodes of a resistor bridge 408. Resistor bridge 408 includes resistive elements 410 and 412, which are coupled at their ends to output terminals 404 and 406 and a common reference terminal 414 as shown. In the embodiment of FIG. 4, common reference terminal 414 is coupled to ground although, as will be shown in a subsequent figure, common reference terminal 414 may alternatively be coupled to a dynamic feedback signal to dynamically modify the voltages output by unbalanced differential voltage power supply 400. When common reference terminal 414 is coupled to ground, a current limiting resistor (about 10 kΩ in one embodiment) may be inserted between common reference terminal 414 and ground if desired.

In accordance with one particularly advantageous aspect of the present invention, unbalanced voltages may be produced at outputs 420 and 422 of unbalanced differential voltage power supply 400 simply by unbalancing the resistive values of resistive elements 410 and 412.

If resistive element 410 has a higher resistive value than resistive element 412, for example, an offset voltage may be created whereby the positive voltage at terminal 404 is made less positive by the offset voltage, while the negative voltage at terminal 406 is made more negative by the same offset voltage. In this manner, unbalanced differential voltage power supply 400 outputs unbalanced voltages at its outputs 420 and 422, which may then be employed as biasing voltages to the bipolar ESC chuck's poles.

In one example, balanced voltage power source 402 is configured to output, in the absence of resistor bridge 408, +350 V at terminal 404 and −350 V at terminal 406. When a resistive element 412 having a resistive value of about 1.001 MΩ is coupled to terminal 404 (through node 418) and a resistive element 410 having a resistive value of about 2 MΩ is coupled to terminal 406 (via node 416), the differential voltages at outputs 420 and 422 are found to be about +240 V and −460 V respectively (i.e., there is an offset of 110 V). Resistor 430 represents a load resistor to present a finite load to balanced voltage power source 402 (since the chuck to which unbalanced differential voltage power supply 400 is coupled at outputs 420 and 422 typically has a very high impedance). In one embodiment, resistors 430 may have a value of about 470 kΩ. Resistors 432 and 434 are current limiting resistors and leakage sensor resistors. In one embodiment, resistors 432 and 434 may have a value of about 51 kΩ each.

Figure 2:
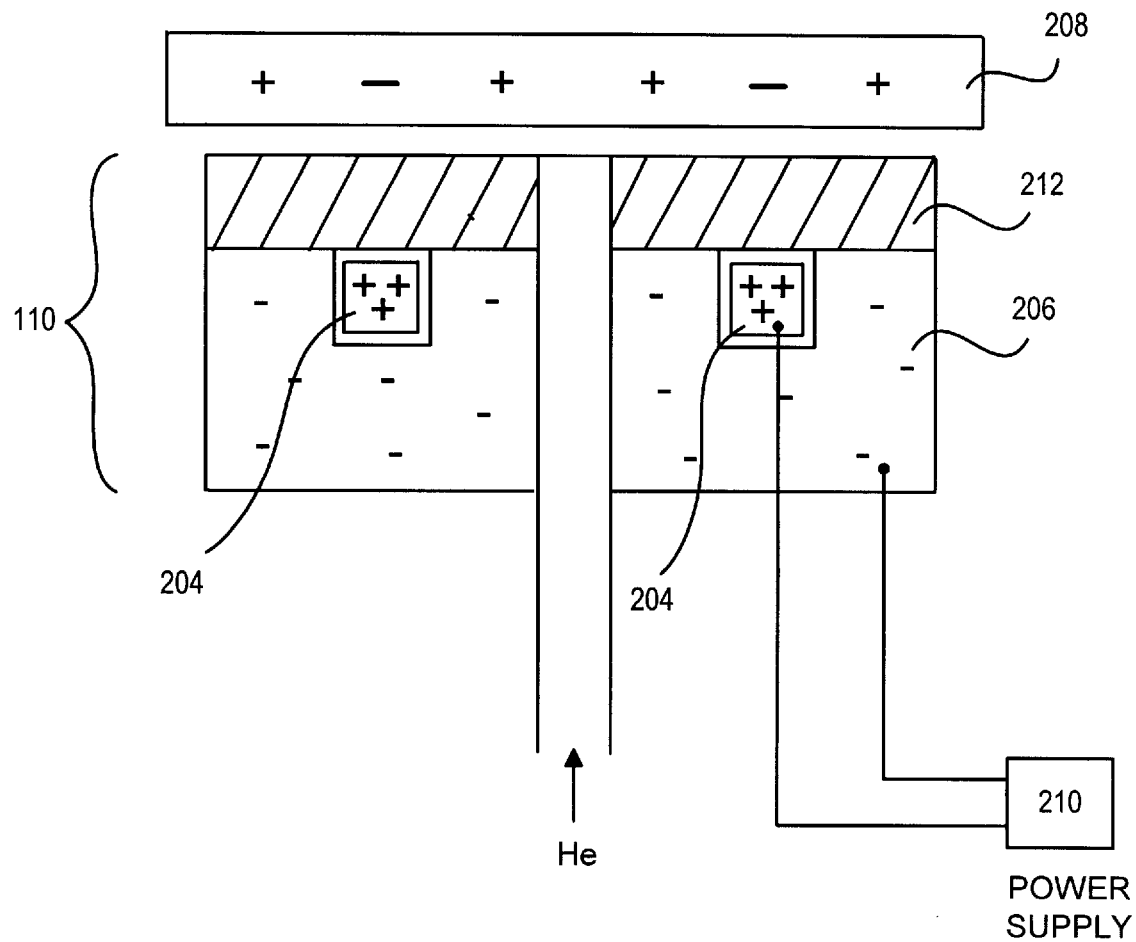
FIG. 2 is a cross-sectional illustration of a bipolar electrostatic chuck.
Figure 3:
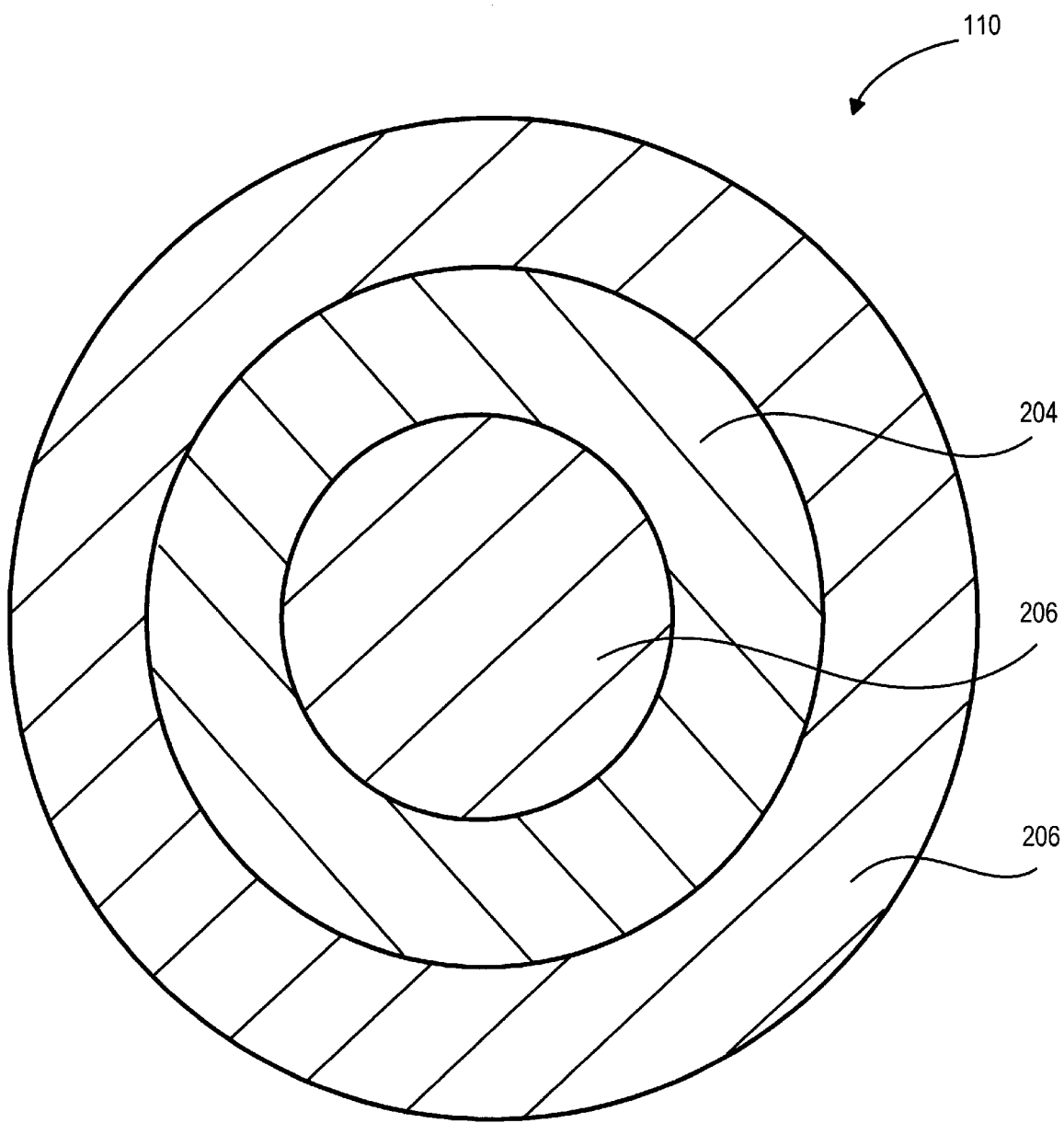
FIG. 3 illustrates a donut-and-base configuration of a bipolar electrostatic chuck.

The differential voltages at outputs 420 and 422 may then be employed to bias the poles of the bipolar ESC chuck (e.g., chuck 110 of FIG. 2) with positive and negative voltages of different magnitudes. Since the negative output voltage is made more negative relative to common ground, the invention advantageously maintains a large potential difference between the substrate and the negative pole even when the plasma is turned on and the substrate becomes negatively charged.

Figure 5A:
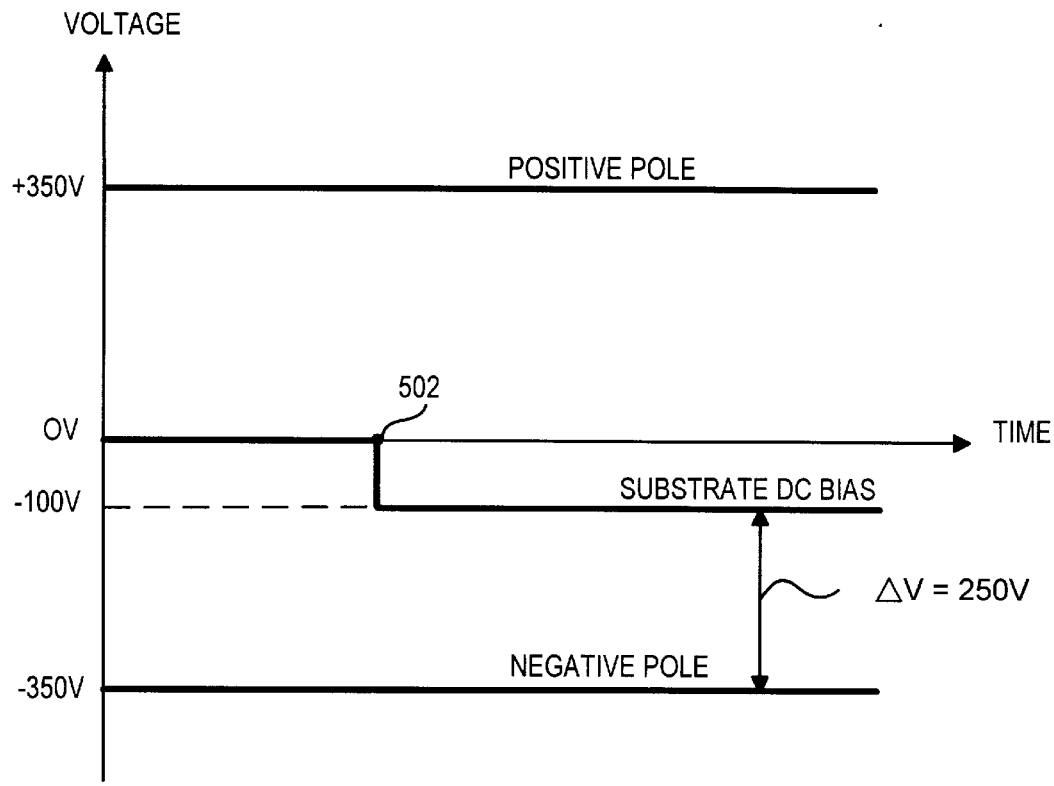
Figure 5B:
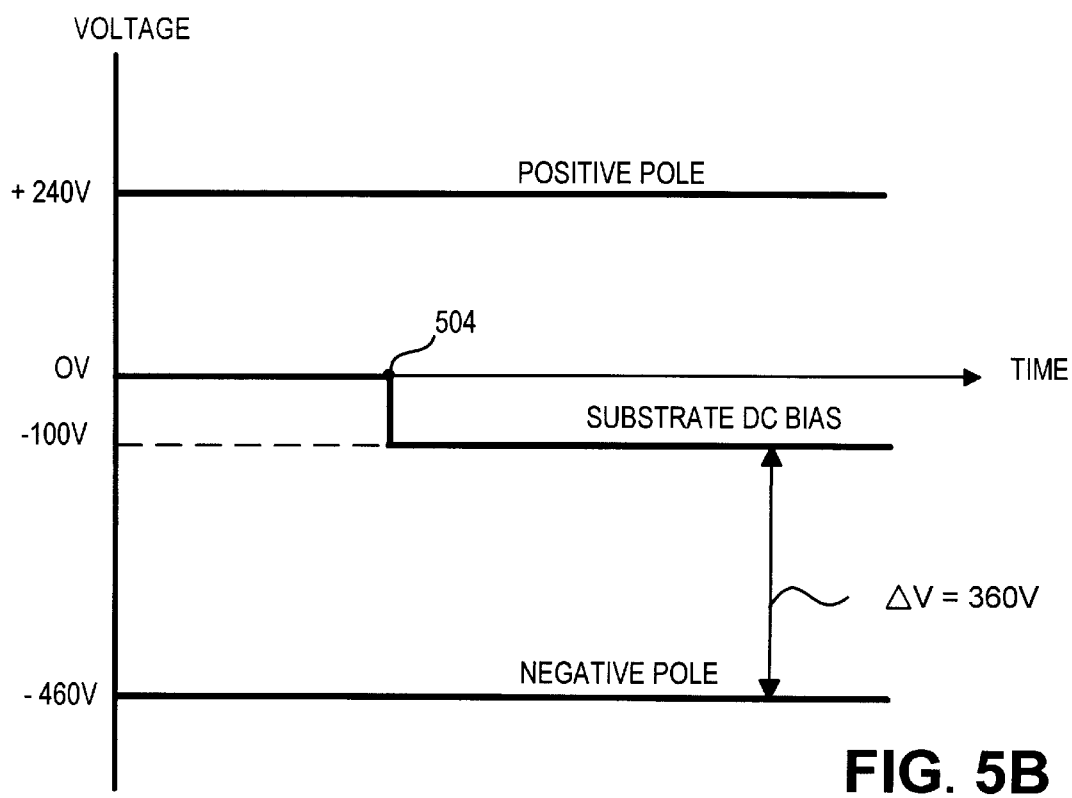

The advantages associated with the configuration of FIG. 4 may be better understood with reference to the voltage plot of FIG. 5A and FIG. 5B. In FIG. 5A, the poles of the bipolar ESC chuck are biased equally at +350 V and −350 V, as were done in the prior art. When RF power is turned on at point 502, the substrate DC bias lowers to −100 V and the potential difference (ΔV) between the negatively charged wafer and the negative pole is lowered to 250 V.

In FIG. 5B, the poles of the bipolar ESC chuck are biased unequally at +240 V and −460 V using the unbalanced differential voltage power supply of FIG. 4. When RF power is turned on at point 504, the substrate DC bias again lowers to −100 V. However, the potential difference (ΔV) between the negatively charged wafer and the negative pole is lowered from a higher ΔV (i.e., 460 V prior to the turning on of the RF power) and is advantageously maintained at a potential difference of 360 V instead. The higher potential difference provided by the present invention translates into a higher electrostatic force clamping the wafer's edge to the chuck's negative base, thus advantageously maintaining a stable flow of cooling helium even when the plasma is turned on.

In one embodiment, resistive elements 410 and 412 represent suitable conventional resistors, or combinations of suitable conventional resistors having off-the-shelf values. The exact values of resistors representing resistive elements 410 and 412 vary depending primarily on the parameters of balanced voltage power source 402 and the desired offset voltage value. In one embodiment, the values of resistors representing resistive elements 410 and 412 may be obtained for a particular offset voltage using a software modeling tool known as "Electronics WorkBench" (version 4) by Interactive Image Technologies, Ltd. (111 Peter Street, Suite 801 of Toronto, Ontario, Canada) or similarly suitable modeling tools.

Note that unbalanced differential voltage power supply 400 of FIG. 4 supplies fixed unbalanced voltages to the bipolar ESC chuck's poles without requiring the use of an additional power supply to offset more negatively the negative output voltage and to offset more positively the positive output voltage. This is highly advantageous since it substantially lowers the cost and complexity of the ESC power supply.

Figure 6:
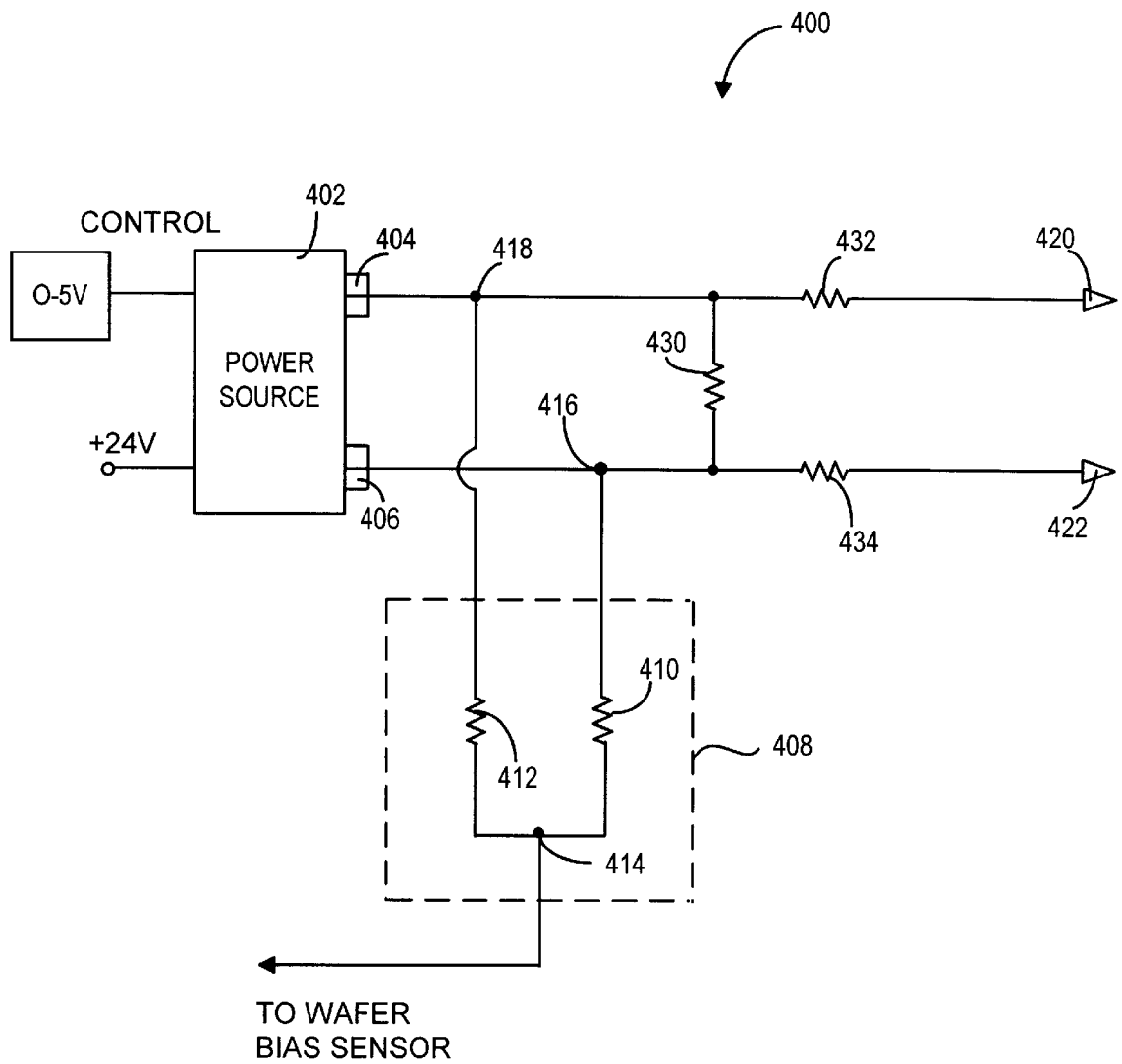
FIG. 6 illustrates, in accordance with one embodiment of the present invention, another embodiment of an unbalanced bipolar electrostatic chuck power supply.

FIG. 6 illustrates, in accordance with another embodiment of the present invention, the unbalanced differential voltage power supply of FIG. 4 in which the common reference terminal 414 is coupled to a wafer bias sensor output instead of ground. When so coupled, the unbalanced differential voltage power supply of FIG. 6 allows the output voltages on outputs 420 and 422 to be dynamically changed responsive to the inferred substrate DC bias value. Wafer bias sensors and the use of their outputs as reference signals may be found in, for example, the aforementioned co-pending patent application Ser. No. 08/624,988.

Figure 9A:
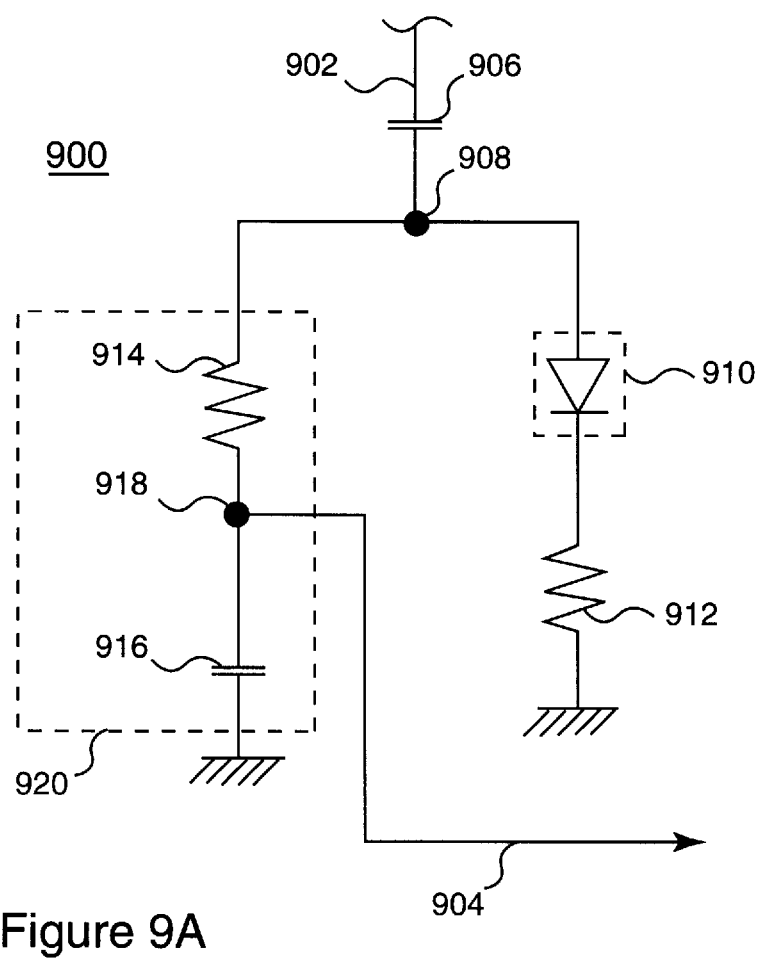
FIG. 9A shows one implementation of the bias sensor.

FIG. 9A shows one implementation of a wafer bias sensor (also referred herein as the RF peak-to-peak voltage detector or peak detector circuit) 900, which performs negative peak detection on the a.c. signal obtained on the bipolar ESC chuck to infer the wafer d.c. bias voltage. It should be borne in mind that the particular implementation shown in FIG. 9A is only exemplary and conventional circuits exist for performing similar negative peak detection task. Since wafer bias sensor 900 is designed to perform negative peak detection on the a.c. RF signal, its components are preferably selected to handle the high voltage, high frequency a.c. signal measured.

Referring now to FIG. 9A, wafer bias sensor 900 receives the RF peak-to-peak a.c. signal measured on the chuck through conductor 902 and outputs the approximated wafer d.c. bias voltage to the common reference terminal of the unbalanced differential voltage power supply through conductor 904. A d.c. blocking capacitor 906 decouples the d.c. voltage level on conductor 902 from conductor 908.

The peak-to-peak information seen on conductor 902 is also present at node 908. Compared to the waveform seen on conductor 902, however, the waveform seen at node 908 is shifted downward by a value whose magnitude approximately equals the magnitude of the RF peak voltage (i.e., ½ the RF peak-to-peak voltage) minus the magnitude of the forward bias voltage of diode module 910. By way of example, if the RF peak-to-peak voltage is about 700 volts and the forward bias voltage of diode module 910 is about 30 volts, the aforementioned downward shift magnitude is about 320 volts (about ½ of 700 volts−30 volts).

Diode module 910 is coupled in parallel with RC circuit 918 and preferably represents a plurality of diodes coupled in series, whose aggregate forward bias voltage approximates the plasma potential, VPL. The use of multiple diodes in series is useful to enable diode module 910 to withstand the high voltage peaks that are present at node 908. In one example, this aggregate forward bias voltage value is approximately 30 volts, which satisfactorily approximates the plasma voltage VPL to the first order. The diode(s) within diode module 910 are preferably selected to be low in capacitance to prevent the formation of a capacitive voltage division circuit and to ensure accurate peak detection of the a.c. signal at node 908.

In one implementation, diode module 910 may comprise about 42 diodes in series, each having a capacitance value of about 2–4 pF. Diode module 910 may have an aggregate capacitance value of less than about 4 pF, and preferably about 0.5 pF. Further, diode module 910 may have a response time of less than about 15 nanoseconds to minimize phase shifting in the a.c. signal at node 908, which introduces errors into the peak detection circuitry. Additionally, each diode in the diode module is preferably coupled in parallel with a voltage balancing resistor, which may have a carbon composition. Further, the voltage balancing resistors preferably have low parasitic capacitance, e.g., less than 2 pF in one case, and low parasitic inductance, e.g., less than 30–50 nH. When the diodes are coupled in series in a diode module, the voltage balancing resistors are thereby coupled in series to evenly distribute the reverse voltage across the diodes to prevent diode reverse breakdown due to excessive reverse voltage.

Resistor 912 is shown coupled between diode module 910 and ground to limit the current surge into diode module 910 and is selected to provide a time constant for charging capacitor 906. In one example, the value of resistor 912 is chosen such that capacitor 906 can be charged in about 800 nanoseconds.

To obtain the d.c. information from the waveform presented at node 908, a low pass filter is employed. In the preferred embodiment, this low pass filter is implemented by RC network 920, which comprises a resistor 914 and a capacitor 916. Since the signal at node 908 is a relatively high voltage a.c. signal, resistor 914 is preferably a low-inductance resistor to minimize power dissipation and to prevent parallel resonance. In one embodiment, resistor 914 has an inductance of below about 50 nH, for example.

Further, resistor 914 is preferably a high-voltage, high-power resistor to withstand the full peak-to-peak voltage at node 908. By way of example, a resistor having a voltage rating of above about 3 Kvolts and preferably at about 6 Kvolts may be suitable. The power rating of this resistor 914 is, in one embodiment, about 15 watts.

In between resistor 914 and capacitor 916, node 918 is coupled to conductor 904 to provide the negative d.c. voltage that approximates wafer d.c. bias voltage to the common reference terminal of the unbalanced differential voltage power supply.

Figure 9B:
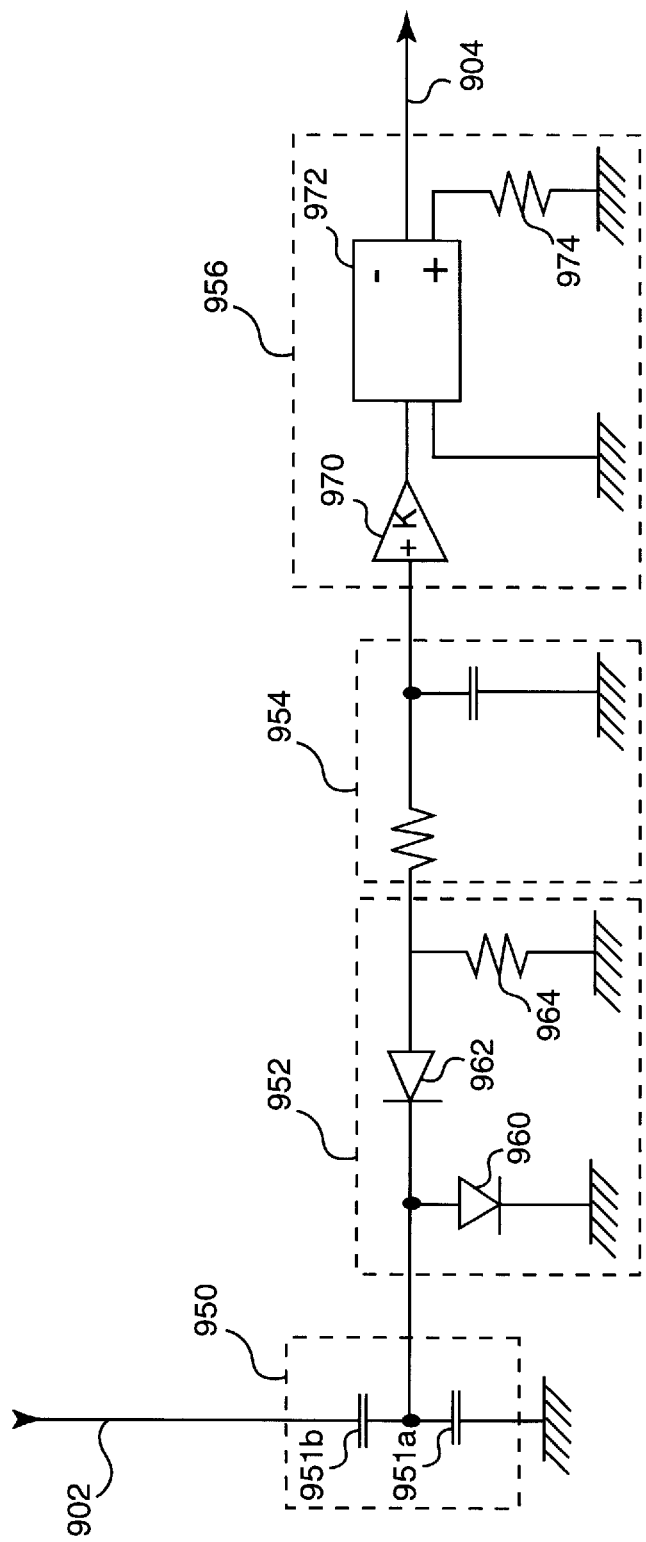
FIG. 9B shows another implementation of the bias sensor.

FIG. 9B illustrates another implementation of the wafer bias sensor 900. Conductor 902 supplies the RF peak-to-peak a.c. signal measured on the chuck to the wafer bias sensor of FIG. 9B. The approximated wafer d.c. bias voltage is output to the common reference terminal of the unbalanced differential voltage power supply through conductor 904.

In the wafer bias sensor implementation of FIG. 9B, circuit block 950 represents an RF signal reduction block, preferably a 100:1 capacitive division circuit with the value of capacitor 951*a* being about 99 times the value of capacitor 951*b*. Circuit block 952 represents a negative peak detector circuit, preferably comprising two fast diodes (960 and 962) and a resistor 964 in the configuration shown. Circuit block 954 is a filter for obtaining a d.c. signal from the output of the negative peak detector circuit of circuit block 952. In the embodiment of FIG. 9B, circuit block 954 is implemented by an RC filter.

Circuit block 956 is a signal amplification circuit to amplify the small d.c. signal output by the filter of circuit block 954. In this embodiment, circuit block 956 provides a gain of 100:1 and comprises a buffer circuit 970 coupled in series with a high voltage variable floating power supply 972. It should be borne in mind that the reduction value of circuit block 950 and the concomitant amplification value of circuit block 956 are not limited to the preferred values specified herein and may be varied as appropriate. The positive terminal of high voltage variable floating power supply 972 may be coupled directly to ground or optionally via a resistor 974 to limit the leakage current. The output of circuit block 956 is then provided to the common reference terminal of the unbalanced differential voltage power supply.

Figure 7A:
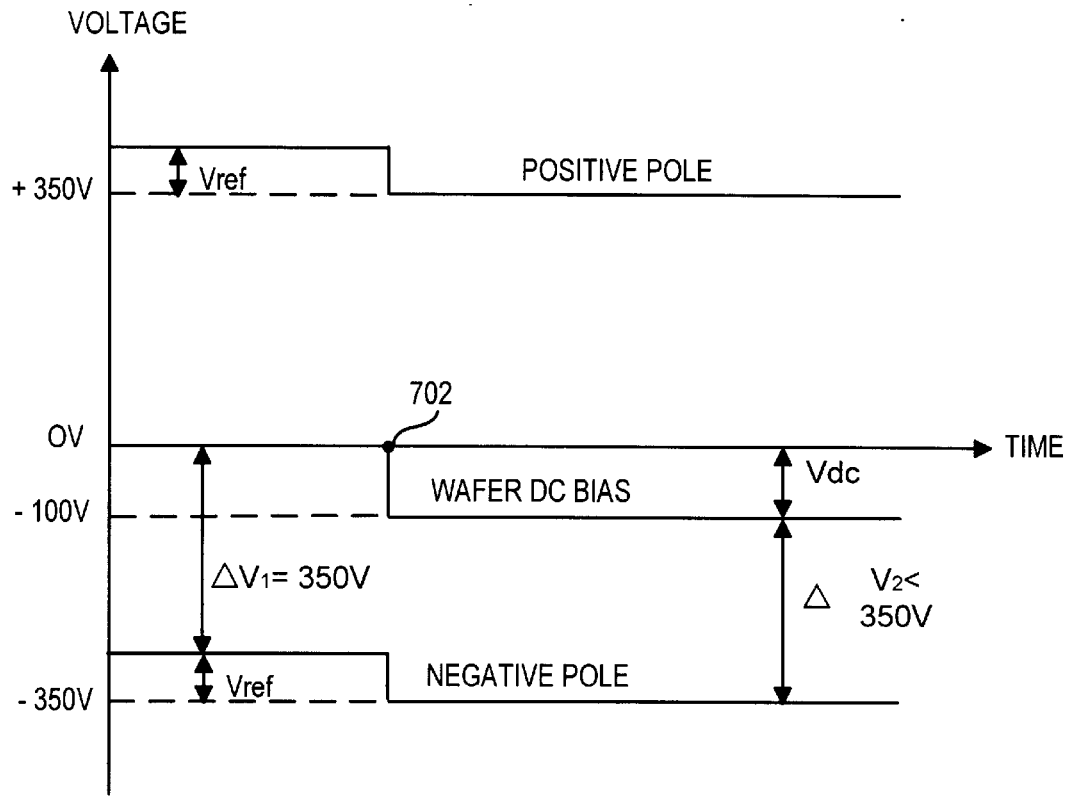

The advantages of this embodiment may be better understood with reference to FIG. 7A. In FIG. 7A, the voltages supplied to the poles of the chuck are balanced, e.g., at +350 V and −350 V. When RF power is turned on at point 702, the DC bias of the substrate is lowered by value Vdc, as shown in FIG. 7A. The inferred substrate DC bias, which is employed as a reference voltage for the balanced power supply, lowers the voltages supplied to both poles by a value Vref. If Vdc=Vref, there should theoretically be no reduction in the level of electrostatic force between the negative pole of the chuck and the negatively charged wafer since the voltage levels of both are lowered by the same amount.

In practice, it has been found, however, that the wafer bias sensor circuit routinely underestimates Vdc. Accordingly, Vref (i.e., the inferred substrate DC bias) is typically less than Vdc (the actual substrate DC bias). As shown in the plot of FIG. 7A, this underestimation causes the voltage level of the negative pole to be lowered by a smaller amount than the amount by which the substrate DC level is lowered. If the substrate DC bias is decreased to −100 V, for example, ΔV may change from about 350 V prior to point 702 (when the plasma is turned on) to somewhat less than 350 V afterwards (due to the underestimation of the substrate DC bias by the RF peak detector circuit). If the potential difference required to maintain a satisfactory level of helium flow is about 350 V, this slight drop may be sufficient to increase the helium leakage to an unacceptable level.

Figure 7B:
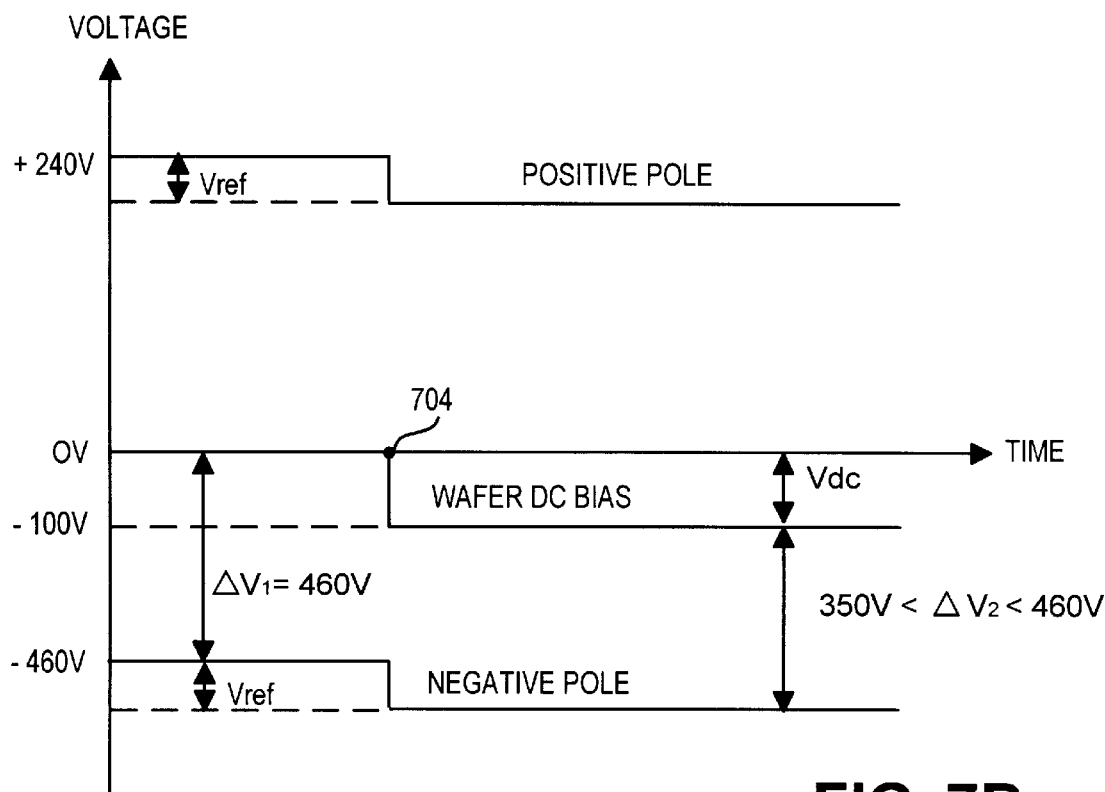

When dynamic feedback (using the inferred substrate DC bias) is employed together with unbalanced ESC chuck power supply of the present invention, it has been found that the voltage difference between the negative pole and the substrate may be adequately maintained even when the substrate becomes negatively charged (when the RF power is turned on). With reference to FIG. 7B, the poles of the bipolar ESC chuck are initially unbalanced, e.g., supplied with +240 V and 460 V respectively. When RF power is turned on at point 704 and the inferred substrate DC bias is employed as a reference for the power supply, this potential difference ΔV2, although decreasing somewhat from ΔV1 due to the aforementioned underestimation problem, is still sufficiently large to maintain an adequate level of electrostatic attraction force between the substrate and the negatively charged wafer (and concomitantly a stable helium flow).

If the substrate DC bias is decreased to −100 V, for example, ΔV may change from about 460 V prior to point 704 (when the plasma is turned on) to slightly less than 460 V afterwards (due to the underestimation of the substrate DC bias by the RF peak detector circuit). Using the previous example discussed in connection with FIG. 7A, if the potential difference required to maintain a satisfactory level of helium flow is about 350 V, the dynamic feedback unbalanced power supply advantageously maintains the potential difference higher than this required value to keep the helium flow stable.

Figure 8:
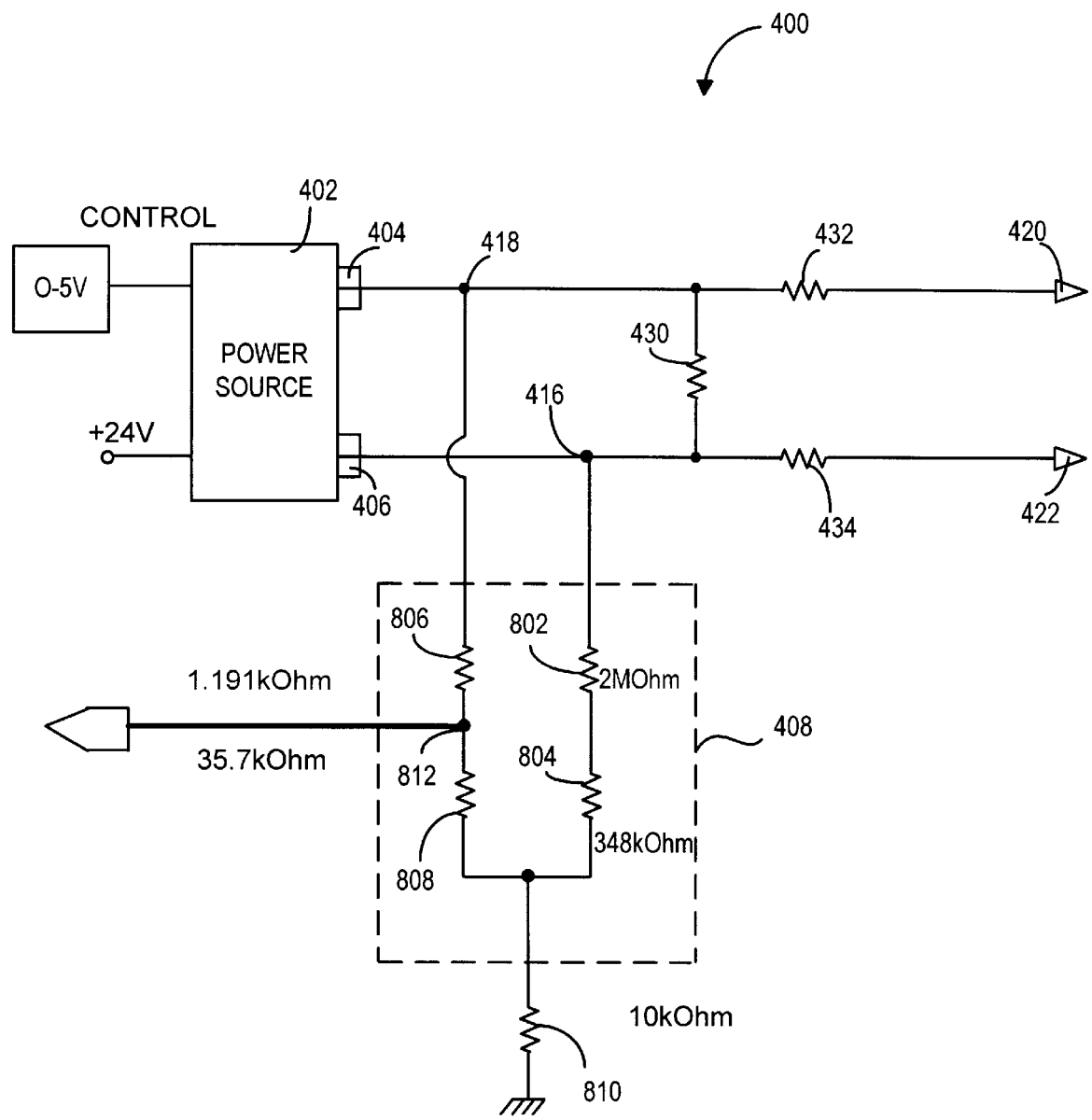
FIG. 8 illustrates, in accordance with one embodiment of the present invention, an static unbalanced bipolar electrostatic chuck power supply.

FIG. 8 illustrates another embodiment of the invention wherein resistor bridge 408, in addition to unbalancing the voltages at outputs 420 and 422 to be supplied to the chuck's poles, further functions as a voltage divider circuit to divide down the potential difference across nodes 418 and 416. In the embodiment of FIG. 8, a signal, representing a fraction of the potential difference across nodes 416 and 418, may be obtained at node 812. Exemplary values for resistors 802, 804, 806 and 808 of resistor bridge 408 are shown to be 2 MΩ, 348 kΩ, 35.7 kΩ, and 1.191 kΩ. In FIG. 8, a current limiting resistor 810 is also shown. An analog-to-digital I/O circuit may be coupled to node 812, for example, to provide the user with data pertaining to the voltages being input into the poles of the ESC chuck. This data may then be employed in monitoring the process being performed on the substrate, for example.

As can be appreciated from the foregoing, the invention advantageously improves the clamping of a substrate to a bipolar electrostatic chuck, particularly a negative-base bipolar electrostatic chuck, during the time the plasma is turned on and the substrate is negatively charged. By simply modifying resistor values in the resistor bridge, the invention advantageously increases the magnitude of the negative voltage supplied to the negative pole to increase the magnitude of the electrostatic force such that an adequate level of electrostatic force between the substrate and the negative pole of the chuck still remains even after the substrate becomes negatively biased due to the plasma. Most importantly, the present invention achieves the foregoing without requiring the use of complicated control circuitries or the use of one or more additional power supplies. With dynamic feedback, an adequate level of clamping force is assured even if the bias power (as well as the magnitude of the wafer's negative voltage) is greatly increased.

While this invention has been described in terms of several preferred embodiments, there are alterations, permutations, and equivalents which fall within the scope of this invention. For example, although the discussion is made herein with reference to a plasma etching reactor, the inventive unbalanced bipolar ESC chuck power supply may be employed in other plasma reactors as well, e.g., those employed for deposition. It should also be noted that there are many alternative ways of implementing the methods and apparatuses of the present invention. It is therefore intended that the following appended claims be interpreted as including all such alterations, permutations, and equivalents as fall within the true spirit and scope of the present invention.

What is claimed is:

1. A method of providing unbalanced voltages to a bipolar electrostatic chuck of a substrate processing chamber, comprising:
   providing a variable balanced voltage power supply, said variable balanced voltage power supply being configured for producing, responsive to a control signal, balanced differential output voltages on a first and second terminals of said variable balanced voltage power supply;
   coupling said first terminal of said variable balanced voltage power supply to a first node, said first node being coupled to a first resistive element of a resistor bridge;
   coupling said second terminal of said variable balanced voltage power supply to a second node, said second node being coupled to a second resistive element of said resistor bridge, said first resistive element being lower in resistance value than said second resistive element; and
   coupling said first resistive element and said second resistive element to a common reference terminal, thereby producing, without employing a power supply other than said variable balanced voltage power supply, said unbalanced voltages at said first node and said second node when said variable balanced voltage power supply is turned on.

2. The method of claim 1 further comprising coupling said common reference terminal to a peak detector circuit output, said peak detector circuit output representing a direct current signal produced responsive to a RF peak-to-peak voltage measured on said bipolar electrostatic chuck, thereby permitting magnitudes of said unbalanced voltages to vary responsive to a magnitude of said peak detector circuit output.

3. The method of claim 2 wherein said first resistive element has a value of about 1.001 MΩ.

4. The method of claim 3 wherein said second resistive element has a value of about 2 MΩ.

5. The method of claim 1 further comprising coupling said common reference terminal to ground, thereby substantially fixing magnitudes of said unbalanced voltages at predefined values.

6. The method of claim 1 further comprising:
   coupling said common reference terminal to a first end of a current limiting resistor; and
   coupling a second end of said current limiting resistor to ground, thereby substantially fixing magnitudes of said unbalanced voltages at predefined values.

7. The method of claim 6 further comprising obtaining a DC voltage at a first voltage monitor node, said first voltage monitor node being coupled to a first resistor of said first resistive element and a second resistor of said first resistive element, wherein said first resistive element comprises said first resistor coupled in series with said second resistor.

8. The method of claim 1 wherein said bipolar electrostatic chuck is of a donut-and-base configuration, said first node being coupled to a donut of said bipolar electrostatic chuck, said second node being coupled to a base of said bipolar electrostatic chuck.

9. An unbalanced differential voltage power supply configured for supplying unbalanced voltages to a bipolar electrostatic chuck of a substrate processing chamber, comprising:
   a variable balanced voltage power supply, said variable balanced voltage power supply being configured for producing, responsive to a control signal, balanced differential output voltages on a first and second terminals of said variable balanced voltage power supply;
   a first node, said first node being coupled to said first terminal of said variable balanced voltage power supply;
   a resistor bridge having a first resistive element coupled in parallel to a second resistive element, said first resistive element being coupled to said first node;
   a second node, said second node being coupled to said second terminal of said variable balanced voltage power supply and said second resistive element, said first resistive element being lower in resistance value than said second resistive element; and
   a common reference terminal coupled to said first resistive element and said second resistive element, whereby said unbalanced voltages are produced, without employing a power supply other than said variable balanced voltage power supply, at said first node and said second node when said variable balanced voltage power supply is turned on.

10. The unbalanced differential voltage power supply of claim 9 further comprising an RF peak-to-peak voltage detector coupled to said common reference terminal, said RF peak-to-peak voltage detector measuring an RF peakto-peak voltage measured on said bipolar electrostatic chuck and producing a direct current signal responsive thereto at said common reference terminal, thereby permitting magnitudes of said unbalanced voltages to vary responsive to a magnitude of said peak detector circuit output.

11. The unbalanced differential voltage power supply of claim 10 wherein said first resistive element has a value of about 1.001 MΩ.

12. The unbalanced differential voltage power supply of claim 11 wherein said second resistive element has a value of about 2 MΩ.

13. The unbalanced differential voltage power supply of claim 9 wherein said common reference terminal is coupled to ground, thereby substantially fixing magnitudes of said unbalanced voltages at predefined values.

14. The unbalanced differential voltage power supply of claim 13 wherein said predefined values are about −460 Volts and about 240 Volts, respectively.

15. The unbalanced differential voltage power supply of claim 9 wherein said common reference terminal is coupled to a first end of a current limiting resistor, a second end of said current limiting resistor is coupled to ground, thereby substantially fixing magnitudes of said unbalanced voltages at predefined values.

16. The unbalanced differential voltage power supply of claim 15 wherein said first resistive element comprises a first resistor coupled in series with a first voltage monitor node and a second resistor, said voltage monitoring node being configured for providing a DC voltage representing a fraction of said unbalanced voltages.

17. An unbalanced differential voltage power supply configured for supplying unbalanced voltages to a bipolar electrostatic chuck of a substrate processing chamber, comprising:

a balanced voltage power supply, said balanced voltage power supply being configured for producing balanced differential output voltages on a first and second terminals of said balanced voltage power supply;

means, coupled to said first terminal and said second terminal, for unbalancing said differential output voltages, thereby producing said unbalanced voltages, said means for unbalancing includes:

a first resistive means coupled to said first terminal;

a second resistive means coupled to said second terminal, said first resistive means being lower in resistance value than said second resistive means; and a reference terminal coupled to said first resistive means and said second resistive means.

18. The unbalanced differential voltage power supply of claim 17 wherein said common reference terminal is coupled to a peak detector circuit output, said peak detector circuit output representing a direct current signal produced responsive to a RF peak-to-peak voltage measured on said bipolar electrostatic chuck, to permit magnitudes of said unbalanced voltages to vary responsive to a magnitude of said peak detector circuit output.

19. The unbalanced differential voltage power supply of claim 17 wherein said common reference terminal is coupled to ground to substantially fix magnitudes of said unbalanced voltages at predefined values.

20. The unbalanced differential voltage power supply of claim 17 wherein said common reference terminal is coupled to a first end of a current limiting resistor, a second end of said current limiting resistor is coupled to ground, to substantially fix magnitudes of said unbalanced voltages at predefined values.

* * * * *